United States Patent
Harrison et al.

(10) Patent No.: US 6,362,426 B1
(45) Date of Patent: *Mar. 26, 2002

(54) RADIUSED LEADFRAME

(75) Inventors: Ronnie M. Harrison, Boise; David J. Corisis, Meridian, both of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/004,214

(22) Filed: Jan. 9, 1998

(51) Int. Cl.$^7$ .............................. H01L 23/28; H05K 5/06
(52) U.S. Cl. ....................... 174/52.2; 257/666; 257/668; 257/692
(58) Field of Search ................................ 174/52.2, 52.4; 257/666, 668, 692, 693; 361/773

(56) References Cited

U.S. PATENT DOCUMENTS

| | | | |
|---|---|---|---|
| 4,743,956 A | 5/1988 | Olla et al. ................... 257/674 |
| 4,974,053 A | * 11/1990 | Kinoshita et al. ........... 257/666 |
| 5,115,298 A | 5/1992 | Loh ............................ 257/691 |
| 5,138,430 A | 8/1992 | Gow, 3rd, et al. .......... 257/712 |
| 5,200,364 A | 4/1993 | Loh ............................. 29/827 |
| 5,313,102 A | 5/1994 | Lim et al. .................... 257/787 |
| 5,397,916 A | 3/1995 | Normington ................ 257/686 |
| 5,457,340 A | 10/1995 | Templeton, Jr. et al. .... 257/666 |
| 5,569,956 A | 10/1996 | Chillara et al. ............. 257/668 |

* cited by examiner

Primary Examiner—Dean A. Reichard
Assistant Examiner—Hung V Ngo
(74) Attorney, Agent, or Firm—TraskBritt

(57) ABSTRACT

A leadframe with a plurality of leads. The leads of the leadframe extend radially from a first end to a second end such that a portion of each lead has a generally arcuate shape. The first end is for coupling with a printed circuit board. The second end is for coupling the a semiconductor die. Alternatively, the leads have a plurality of segments. Each lead has at least three segments disposed between the first end and the second end. The segments forming the leads are disposed such that each lead generally has an arcuate shape. The segments each have substantially the same length, or can have varying lengths. An integrated circuit package is also disclosed including a leadframe having a plurality of leads, at least one semiconductor die coupled with the leads, and an insulating enclosure encapsulating the die and a portion of the leadframe. The leads each extend radially from a first end to a second end such that each lead has a generally arcuate shape. The leads can also have at least three segments disposed between the first end and the second end.

19 Claims, 5 Drawing Sheets

RADIUSED LEADFRAME

FIELD OF THE INVENTION

The present invention relates generally to integrated circuit semiconductor chips. More particularly, it pertains to leadframes for bonding with the integrated circuits.

BACKGROUND OF THE INVENTION

Integrated circuit manufacturers face many design challenges, including reducing the amount of noise in the integrated circuit. Resistance, capacitance and inductance, parasitics of an integrated circuit package, can result in increased signal delays and signal distortions in the electrical signals transmitted to and from the integrated circuit.

Two sources of noise in an integrated circuit package are switching noise and crosscoupling noise, or crosstalk. Switching noise may be an inductive voltage spike that occurs on a conductive path as the result of rapid current switching in the conductive path. Crosstalk is the undesirable appearance of an electrical current in a conductive path as a result of mutual capacitance and inductance between the conductive path and other nearby conductive paths. At higher frequencies, the integrated circuit is even more susceptible to noise.

One approach to reduce noise in an integrated circuit is to increase spacing between transmission lines, such as leads of a leadframe 100 as shown in FIG. 1. The individual leads 110 forming a right angle are curved in a small portion of the lead and have tightly radiused corners 118. However, as integrated circuits and electronic equipment become smaller and more complex, spacing transmission lines farther apart becomes increasingly difficult, if not impossible.

Another approach to reduce noise is to reduce the length of the transmission line on a leadframe by using diagonal leads. While diagonal leads minimize the length of the leads, the spacing between the leads would also be decreased. The decreased spacing would increase the overall crosstalk between the leads, and would therefore be undesirable.

Accordingly, there is a need for an integrated circuit package in which the above benefits are achieved and the above problems overcome.

SUMMARY OF THE INVENTION

The present invention solves the above-mentioned needs in the art and other needs which will be understood by those skilled in the art upon reading and understanding the present specification.

A leadframe is provided comprising, in part, a first and second set of conductors. The leadframe is adapted for coupling with a semiconductor integrated circuit. The conductors of the leadframe extend radially from a first end to a second end such that a portion of each conductor has a generally arcuate shape between the first and second end. In one embodiment, the first end of the conductor is for coupling with a printed circuit board, and the second end is for coupling with a semiconductor die. Alternatively, each conductor is sized and spaced such that the line spacing remains constant.

In another embodiment, the conductors have a plurality of segments. Each conductor has at least three segments disposed between the first end and the second end. The segments forming the conductors are disposed such that a portion of each conductor generally has an arcuate shape. In another embodiment, the segments each have substantially the same length. Alternatively, the segments have varying lengths.

In one embodiment, an integrated circuit package is provided comprising a leadframe having a plurality of leads, at least one semiconductor die coupled with the plurality of leads, and an insulating enclosure encapsulating the die and a portion of the leadframe. The leads each extend radially from a first end to a second end such that a portion of each lead has a generally arcuate shape. Alternatively, in another embodiment, the leads each have at least three segments disposed between the first end and the second end.

BRIEF DESCRIPTION OF THE DRAWINGS

In the drawings, where like numerals refer to like components throughout the several views.

PREFERRED DESCRIPTION OF THE EMBODIMENTS

In the following detailed description, reference is made to the accompanying drawings which form a part hereof, and in which is shown, by way of illustration, specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. Therefore, the following detailed description is not to be taken in a limiting sense, and the scope of the present invention is defined by the appended claims.

Figure 2:
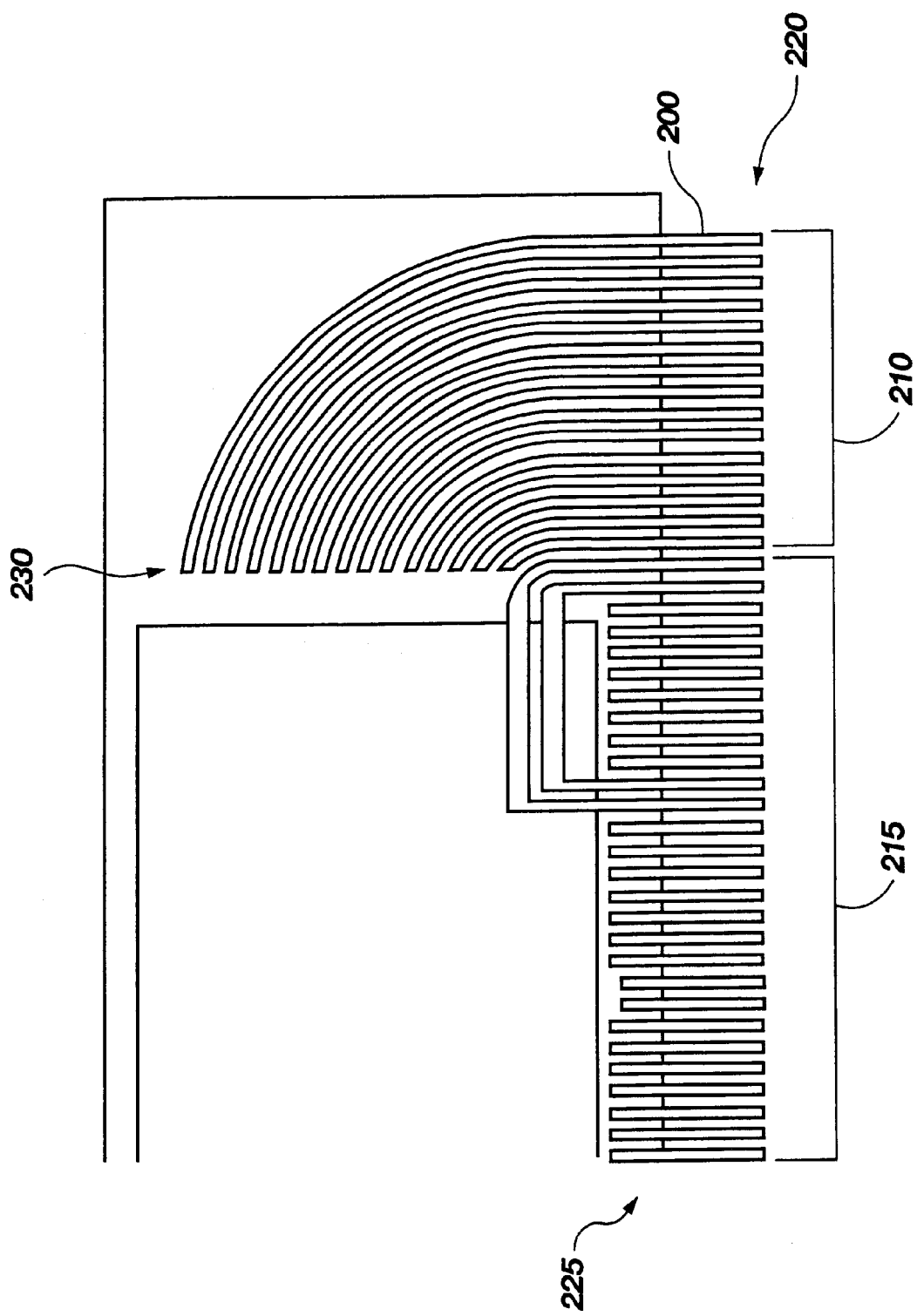
FIG. 2 is a top plan view illustrating a leadframe constructed in accordance with one embodiment of the present invention.

A portion of a leadframe 200 is illustrated in FIG. 2. The leadframe 200 has first and second sets of leads 210, 215. Although leads are discussed, other conductors can be used, such as lead fingers, and are considered within the scope of the invention. The first set of leads 210 extends from a first end 220 to a second end 230, and the second set of leads 215 extends from the first end 220 to a third end 225. For the first set of leads 210, the first end 220 is substantially perpendicular to the second end 230. For the first and second set of leads 210, 215, the first end 220 is for electrically coupling with an electronic system, such as a printed circuit board. The first end can be coupled using reflow solder, and other methods as known by those skilled in the art. The second end 230 of the first set of leads 210 and the third end 225 of the second set of leads 215 are adapted for coupling with a semiconductor die, as will be discussed further below.

In one embodiment, a portion of each lead of the first set of leads 210 has a generally arcuate shape, as the lead 210 extends radially from the first end 220 to the second end 230. For some of the first set of leads 210, a substantial portion of the lead has a generally arcuate shape. The arcuate shape of each lead of the first set of leads 210 has a different arc length than the other leads of the first set of leads 210. In another embodiment, each lead of the first set of leads 210 is spaced and sized such that the line spacing between at least one lead, or alternatively each lead, remains constant from the first end 220 to the second end 230. Each lead of the second set of leads 215 extends substantially straight from the first end 220 to the third end 225.

Figure 3:
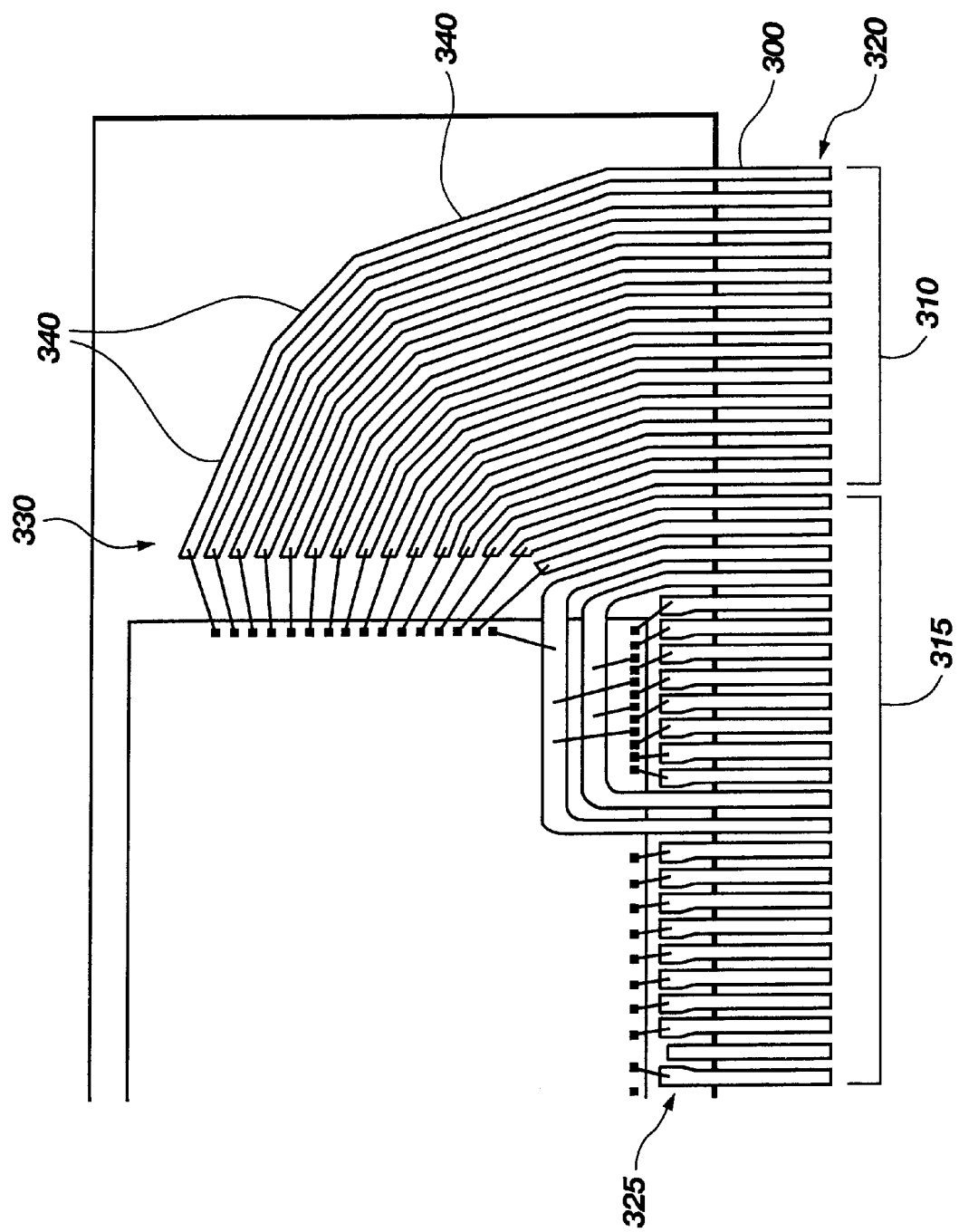
FIG. 3 is a top plan view illustrating a leadframe constructed in accordance with another embodiment of the present invention.

Another embodiment is illustrated in FIG. 3. A leadframe 300 has first and second sets of leads 310, 315. The first set of leads 310 extends from a first end 320 to a second end 330, and the second set of leads 315 extends from the first end 320 to a third end 325. In one embodiment, the first end 320 of each lead of the first set of leads 310 is substantially perpendicular to the second end 330. For both the first and second sets of leads 310, 315, the first end 320 of each lead is for electrically coupling with a printed circuit board. The second end 330 of the first set of leads 310 and the third end 325 of the second set of leads 315 are adapted for coupling with a semiconductor die, as will be discussed further below.

Figure 5:
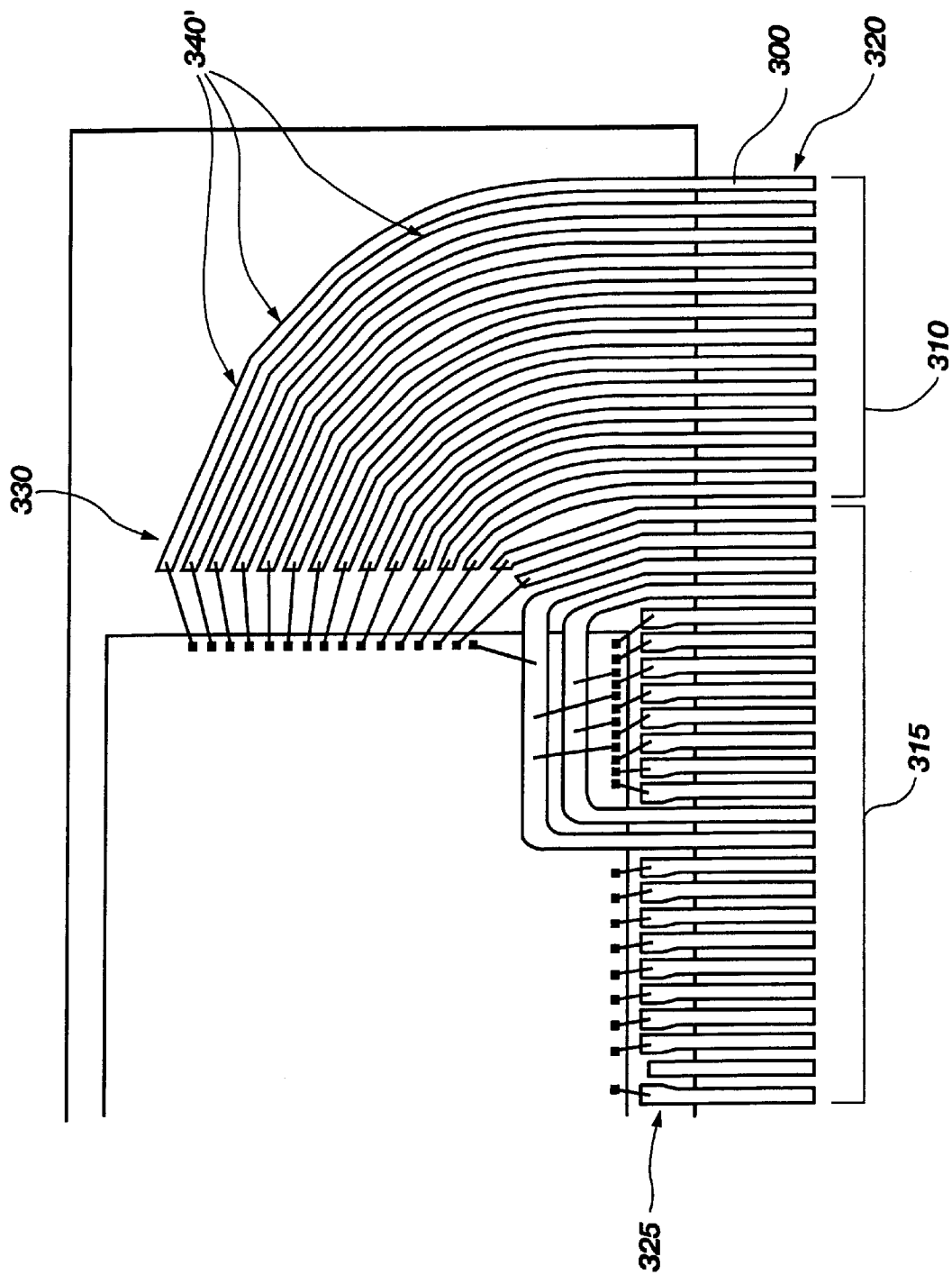
FIG. 5 is a top plan view illustrating leadframe constructed in accordance with another embodiment of the present invention.

In one embodiment, each lead of the first set of leads 310 has at least three segments 340. The segments 340 are disposed such that a portion of each lead of the first set of leads 310 has a generally arcuate shape between the first end 320 and the second end 330. The arcuate shape of each lead of the first set of leads 310 has a different arc length than the other leads of the first set of leads 310. The segments 340 are substantially straight, and are each substantially the same length and substantially the same width. In one embodiment, at least one of the segments 340 is substantially straight and has a different length. In another embodiment, at least one of the segments 340' has an arcuate shape as shown in FIG. 5. Each lead of the second set of leads 315 extends substantially straight from the first end 320 to the third end 325. The segmented leads provide a significant advantage since they are stamped, which is easier and less expensive to manufacture.

The leadframe 200 of FIG. 2 and the leadframe 300 of FIG. 3 are formed from a single sheet of material or thin strip which is etched or stamped into a predetermined shape for connection with a selected chip design. The leads off the die are substantially flat. However, the leads or sections of the leadframe that extend over the die may need to be upset or downset, depending upon where the parting line of the mold is formed. After encapsulation in plastic, portions of the leadframe extend out of the respective chip packages. In one embodiment, the leadframe extends out of the sides of the packages at a selected elevation which is determined in advance. These outwardly extending portions include the ends of the leads of a package. These leads may be ultimately bent for insertion into a suitable connector device.

Figure 4:
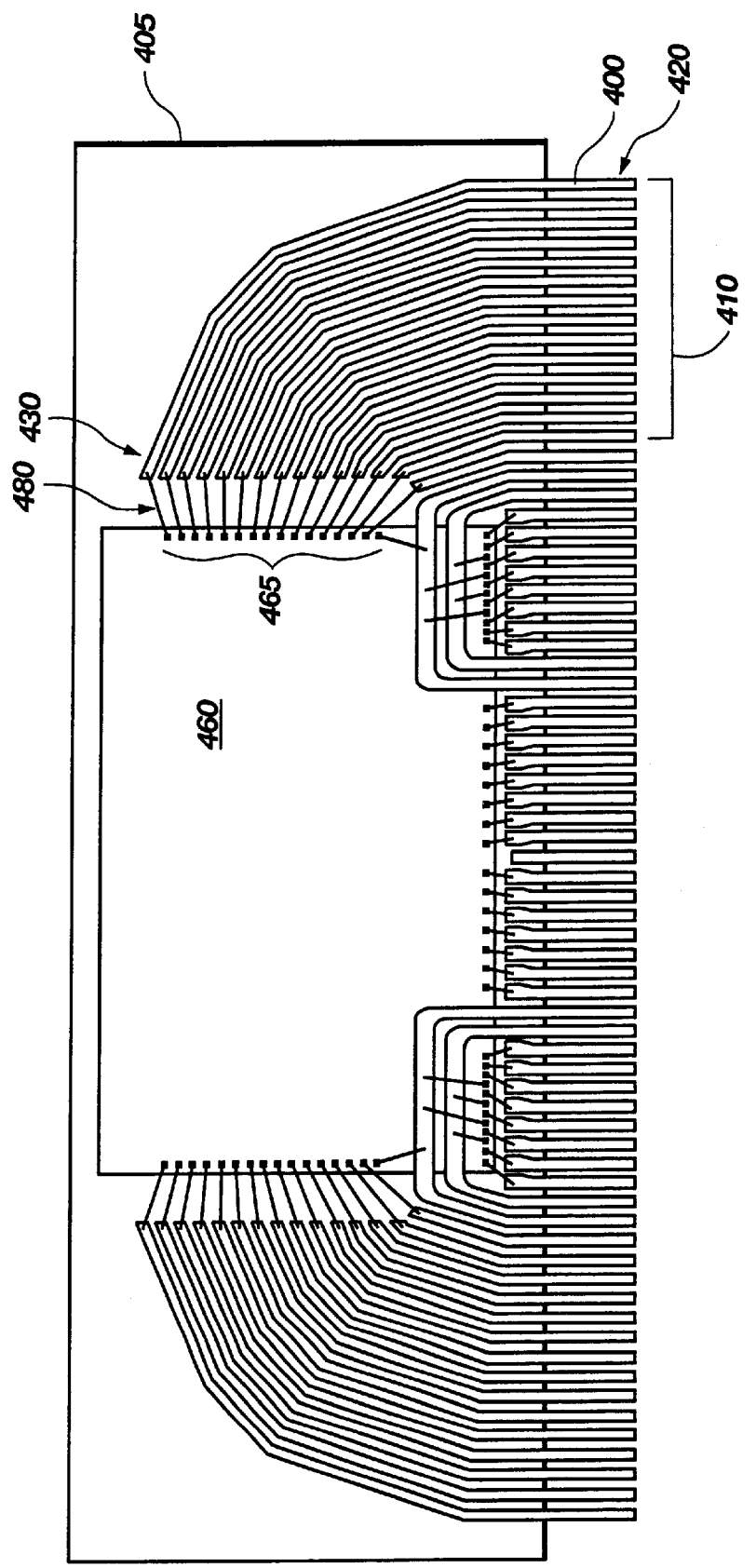
FIG. 4 is a top plan view illustrating an integrated circuit package constructed in accordance with one embodiment of the present invention.

As shown in FIG. 4, a leadframe 400 is assembled into an integrated circuit package 405. A semiconductor die 460 comprises circuitry (not shown) formed centrally on the die 460 and a plurality of bond pads 465 formed around the periphery of the die 460. The semiconductor die 460 is mounted using LOC technology with additional support from the leadframe at the edge of the die opposite the bond pad (not shown). Electrically conductive wire bonding 480 is used to connect selected bond pads 465 on the die 460 to selected leads of the leadframe 400. A portion of each lead of the first set of leads 410 of the leadframe 400 is formed in a generally arcuate shape. In one embodiment, a portion of the first set of leads 410 extends radially from a first end 420 to a second end 430. Alternatively, the first set of leads 410 includes a plurality of segments for forming the arcuate shape.

In one embodiment, the leadframe 400, semiconductor die 460 and wire bonding 480 are enclosed in protective, electrically insulative material such that ends of the leads are exposed to allow connection to be made to other electrical components. In another embodiment, leadframe 400, semiconductor die 460 and wire bonding 480 are encapsulated in plastic, thereby forming the integrated circuit package 405.

An integrated circuit package including the leadframe according to the invention has reduced effective inductance and crosstalk relative to existing integrated circuit packages. Below are simulated inductances and resistances for the tightly radiused leads of the conventional right angle leadframe shown in FIG. 1, and the leads of the arcuate leadframe shown in FIG. 2. The lead number refers to leads shown in FIGS. 1 and 2. Like numbers in the figures indicate leads connecting between same locations on the die and same exterior connections.

TABLE 1

Figure 1:
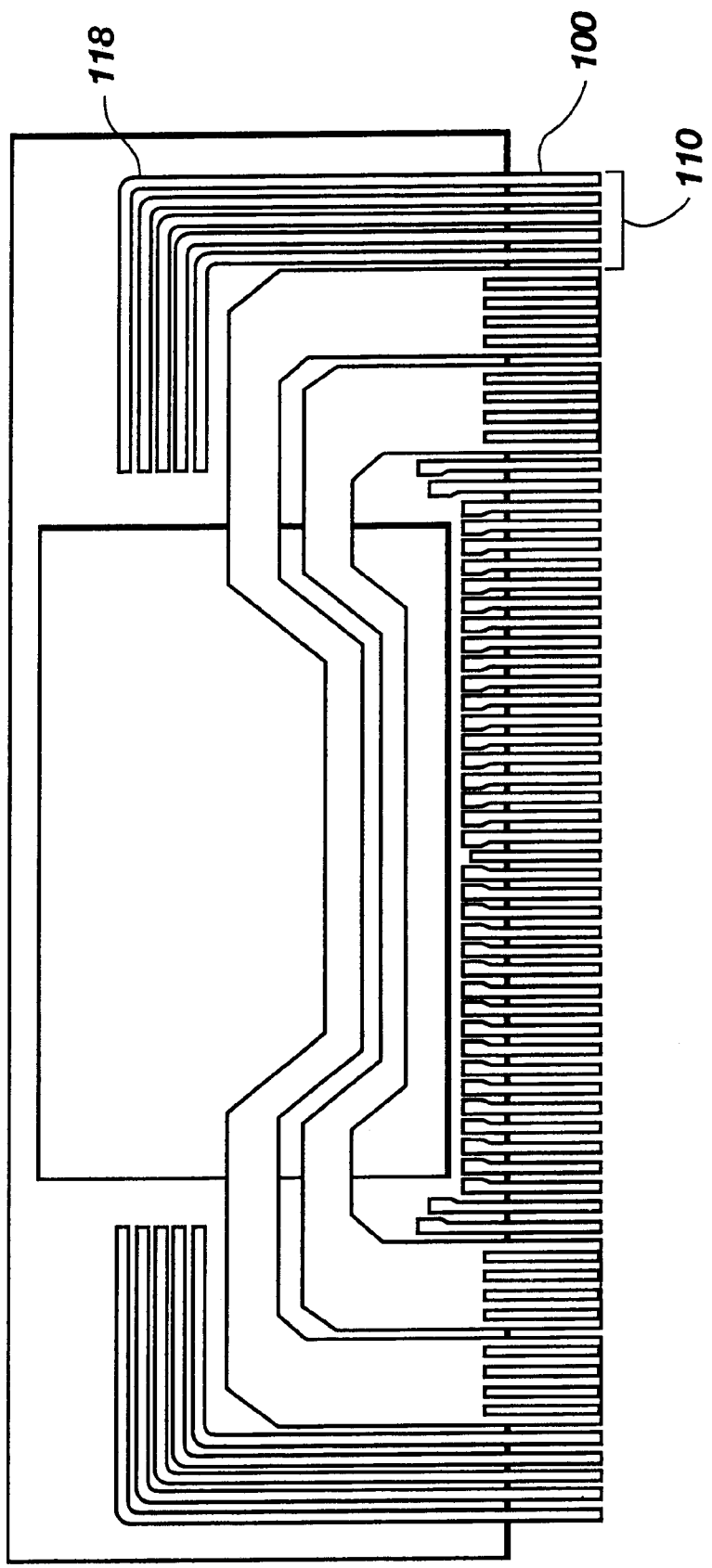
FIG. 1 is a top plan view illustrating a conventional leadframe having leads with tightly radiused corners.

| Lead No. | Prior Art Lead FIG. 1 (nH \| Ohms) | Radiused Lead FIG. 2 (nH \| Ohms) |
| --- | --- | --- |
| 1 | 10.30 \| .514 | 9.62 \| .452 |
| 2 | 9.38 \| .522 | 8.85 \| .466 |
| 3 | 8.71 \| .506 | 8.29 \| .451 |
| 4 | 8.08 \| .476 | 7.83 \| .432 |
| 5 | 7.32 \| .423 | 7.39 \| .409 |

The results in Table 1 reveal the decreased inductance for the present invention. The inductance and resistance of each lead is less for the arcuate leadframe and the segmented leadframe, than in the tightly radiused leadframe. In particular, the longer leads experience the greatest improvement in using the arcuate leadframe and the segmented leadframe versus the tightly radiused leadframe.

Advantageously, the radiused leadframe provides for lower inductance, resistance, and capacitance of leads in a leadframe, as opposed to leads with tightly radiused corners. These factors are important when the leads are carrying high-frequency signals, or signals having high-frequency harmonics, such as sub-nanosecond rise times. The continuous arcuate shape of the leads and the constant width of the leads maintains line spacing between the leads. This consistency maximizes layout space of the leadframe without increasing crosstalk. In addition, a single leadframe strip or assembly can comprise leadframes for any number of a predetermined number of chips.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A leadframe adapted for coupling with a semiconductor integrated circuit, the leadframe comprising:

a first set of conductors extending from a first end to a second end;

a second set of conductors extending from the first end to a third end, the first end of the first and second sets of conductors being adapted for coupling with an electronic system, the second end of the first set of conductors and the third end of the second set of conductors being adapted for coupling with the semiconductor integrated circuit;

each of the first set of conductors including an arcuate shape portion between the first and second ends, at least a portion of the arcuate shape portion exhibiting a constant radius, wherein the arcuate shape portion of one of the conductors of the first set of conductors has a different arc length than the arcuate shape portion of at least one other conductor of the first set of conductors, at least two conductors of the first set of conductors are sized and spaced such that line spacing between the at least two conductors of the first set of conductors is constant through at least the arcuate shape portions of the at least two conductors, and at least one conductor of the first set of conductors includes a constant width through the arcuate shape portion; and each of the second set of conductors extending substantially straight from the first end to the third end.

2. The leadframe as recited in claim 1, wherein conductors of the first and second sets are lead fingers.

3. The leadframe as recited in claim 1, wherein each conductor of the first set of conductors is sized and spaced such that line spacing between adjacent conductors is constant through the arcuate shape portions of the adjacent conductors.

4. The leadframe as recited in claim 1, wherein the first end of the first and second set of conductors is adapted for coupling with a printed circuit board of the electronic system.

5. The leadframe as recited in claim 1, wherein the arcuate shape portion of at least one conductor of the first set of conductors is formed in a substantial portion of the at least one conductor.

6. The leadframe as recited in claim 1, wherein the arcuate shape portion of each conductor of the first set of conductors has a different arc length than the arcuate shape portion of the at least one other conductor of the first set of conductors.

7. A leadframe adapted for coupling with a semiconductor integrated circuit, the leadframe comprising:

a first set of conductors each extending from a first end to a second end;

a second set of conductors each extending from the first end to a third end, the first end of the first and second sets of conductors located for coupling along a common plane with a printed circuit board, the second end of the first set of conductors located for coupling with the semiconductor integrated circuit along a first edge of the semiconductor integrated circuit, and the third end of the second set of conductors located for coupling with the semiconductor integrated circuit along a second edge of the semiconductor circuit wherein the first edge is adjacent to the second edge; and each conductor of the first set of conductors comprising at least four segments and having a generally arcuate shape portion between the first and second ends of each conductor of the first set of conductors, each generally arcuate portion comprising at least three of the at least four segments wherein at least one conductor of the first set of conductors includes a constant width at least through the generally arcuate shape portion, and wherein at least one of the at least three segments of the generally arcuate shape portion of at least one conductor of the first set of conductors is generally straight, and at least one segment of the at least three segments of the generally arcuate shape portion of at least one conductor is generally arcuate.

8. The leadframe as recited in claim 7, wherein the generally arcuate shape portion of at least one conductor of the first set of conductors exhibits a different overall length than the generally arcuate shape portion of at least one other conductor of the first set of conductors.

9. The leadframe as recited in claim 7, wherein at least one segment of the at least three segments of the generally arcuate shape portion of at least one conductor of the first set of conductors has a different length than another segment of the at least three segments of the generally arcuate shape portion of the at least one conductor.

10. The leadframe as recited in claim 7, wherein at least two conductors of the first set of conductors are sized and spaced such that line spacing between the at least two conductors of the first set of conductors is constant.

11. The leadframe as recited in claim 7, wherein each conductor of the second set of conductors extends substantially straight from the first end to the third end.

12. An integrated circuit package comprising:

a leadframe having at least a first set of conductors, each of the first set of conductors extending from a first end to a second end and further including an arcuate shape portion between the first and second ends, at least a portion of the arcuate shape portion exhibiting a constant radius, wherein the arcuate shape portion of one of the conductors of the first set of conductors has a different arc length than the arcuate shape portion of at least one other conductor of the first set of conductors, at least two conductors of the first set of conductors are sized and spaced such that line spacing between the at least two conductors is constant through at least the arcuate shape portions of the at least two conductors, and at least one conductor of the first set of conductors includes a constant width through the arcuate shape portion;

at least one semiconductor die coupled with the first set of conductors; and an insulating enclosure encapsulating the at least one semiconductor die and a portion of the leadframe.

13. The integrated circuit package as recited in claim 12, wherein the arcuate shape portion of each conductor of the first set of conductors comprises at least three segments, one of the three segments including the at least a portion having a constant radius.

14. The integrated circuit package as recited in claim 12, wherein the at least one semiconductor die is coupled to the leadframe with wire bonding.

15. The integrated circuit package as recited in claim 12, wherein the insulating enclosure comprises plastic.

16. An integrated circuit package comprising:

a leadframe having a first set of conductors extending from a first end to a second end and a second set of conductors extending from a first end to a second end, each of the first set of conductors comprising at least four segments and including a generally arcuate shape portion between the first and second ends comprising at least three of the at least four segments wherein at least one conductor of the first set of conductors includes a constant width through the generally arcuate shape portion, and wherein at least one segment of the at least three segments of the generally arcuate shape portion of at least one conductor of the first set of conductors is generally straight, and at least one segment of the at least three segments of the generally arcuate shape portion of the at least one conductor is generally arcuate;

at least one semiconductor die having a first edge and a second adjacent edge, wherein the first set of conduc tors is coupled with the semiconductor die along the first edge and wherein the second set of conductors are coupled with the semiconductor die along the second adjacent edge; and an insulating enclosure encapsulating the at least one semiconductor die and a portion of the leadframe.

17. The integrated circuit package as recited in claim 16, wherein the generally arcuate shape portion of at least one conductor of the first set of conductors exhibits a different overall length than the generally arcuate shape portion of at least one conductor of the first set of conductors.

18. The integrated circuit package as recited in claim 16, wherein at least one segment of the at least three segments of the generally arcuate shape portion of at least one conductor of the first set of conductors has a different length than another segment of the at least three segments of the generally arcuate portion of the at least one conductor.

19. The leadframe as recited in claim 16, wherein at least two conductors of the first set of conductors are sized and spaced such that line spacing between the at least two conductors of the first set of conductors is constant.

* * * * *